United States Patent [19]

Chandrasekhar et al.

[11] Patent Number: 5,063,426

[45] Date of Patent: Nov. 5, 1991

[54] INP/INGAAS MONOLITHIC INTEGRATED PHOTODETECTOR AND HETEROJUNCTION BIPOLAR TRANSISTOR

[75] Inventors: S. Chandrasekhar, Matawan; Bartley C. Johnson, Cranbury, both of N.J.

[73] Assignee: AT&T Bell Laboratories, Murray Hill, N.J.

[21] Appl. No.: 559,818

[22] Filed: Jul. 30, 1990

[51] Int. Cl.$^5$ ............................................. H01L 27/14
[52] U.S. Cl. ....................................... 357/30; 357/43; 357/34; 357/56; 357/16; 357/55; 357/60
[58] Field of Search ................ 357/30 G, 30 E, 30 P, 357/30 D, 16, 34, 34 HB, 43, 58, 56, 55, 60

[56] References Cited

U.S. PATENT DOCUMENTS 4,490,735 12/1984 Schwaderer ..................... 357/30 G
4,794,440 12/1988 Capasso et al. ...................... 357/34

FOREIGN PATENT DOCUMENTS 58-122775 7/1983 Japan ........................... 357/30 L X
63-302557 12/1988 Japan ......................... 357/34 HB X

OTHER PUBLICATIONS

Sasaki et al., "Monolithic Integration of HEMTs and HBTs on an InP Substrate and Its Application to OE-ICs, IEDM", 1989, pp. 896–898.
Renaud et al., "GaInAs Monolithic Photoreceiver Integrating p-i-n/JFET with Diffused Junctions and a Resistor", *Journal of Lightwave Technology*, vol. 6, No. 10, Oct. 1988, pp. 1507–1511.
Antreacyan et al., "Monolithically Integrated InGaAs-P-I-N InP-MISFET PINFET Grown by Chloride Vapor Phase Epitaxy", IEEE Photonics Technology Letters, vol. 1, No. 6, Jun. 1989, pp. 123–125.
Chang et al., "A 3 GH$_8$ Transimpedance OEIC Receiver for 1.3–1.55 μm, Fiber-Optic Systems," IEEE Photonics Technology Letters, vol. 2, No. 3, Mar. 1990, pp. 197–199.
S. Chandrasekhar et al., "Integrated InP/GainAs Heterojunction . . . ", Electronics Letters, 10th Nov. 1988, vol. 24, No. 23, pp. 1443–1444.
H. Nobuhara et al., "Planar Integration Technology For Long . . . ", Optoelectronics, vol. 2, No. 2, Dec. 1987, pp. 303–311.
H. Nobuhara, et al., "Monolithic pinHEMT Receiver . . . ", Electronics Letters, 15th Sep. 1988, vol. 24, No. 19, pp. 1246–1248.
S. J. Kim, et al., "Monolithic Integration of InGaAs p-i-n . . . ", IEEE Electron Device Letters, vol. 9, No. 9, Sep. 1988, pp. 447–449.

*Primary Examiner*—William Mintel
*Attorney, Agent, or Firm*—Gregory C. Ranieri

[57] ABSTRACT

A monolithic integrated photoreceiver comprising a p-i-n photodiode and a heterojunction bipolar transistor is realized in a structural configuration that allows the photonics and electronics to be separately optimized in addition to maintaining materials compatibility. These desirable features are accomplished by growing the epilayers of the photodiode and heterojunction bipolar transistor in a single epitaxial growth run. The p-i-n epilayers of the photodiode are grown first on a non-patterned substrate, followed by the direct epitaxial growth of the heterostructure bipolar transistor over the photodiode structure. Selective wet chemical etching over a portion of the entire structure was used in order to delineate the mesa structures of the p-i-n photodiode and transistor such that no contiguous conductive semiconductor layer exists therebetween.

10 Claims, 5 Drawing Sheets

INP/INGAAS MONOLITHIC INTEGRATED PHOTODETECTOR AND HETEROJUNCTION BIPOLAR TRANSISTOR

TECHNICAL FIELD

The present invention relates to semiconductor devices and, in particular, to semiconductor devices having an integrated photodetector and amplifier which utilize the III-V semiconductor material system.

BACKGROUND OF THE INVENTION

With the rapid development of lightwave communications, low cost, high performance optical receivers are needed for a variety of system applications. It is anticipated that the monolithic integration of a photodetector with a low noise preamplifier offers the potential advantages of reduced parasitic capacitances and inductances, as well as, improved device performance, higher reliability and lower manufacturing cost. Furthermore, since silica fibers have a lower attenuation in the long wavelength range (1.3–1.6 µm), a high degree of interest has been generated by integrated optical receivers which operate in this spectral range.

Unfortunately, the integration of receiver components operating in the long wavelength range necessitates the utilization of Indium Gallium Arsenide (InGaAs) p-i-n photodetectors and, hence, a transistor technology based on Indium Phosphide (InP) substrates in order to avoid strained layer epitaxy because of lattice mismatch. Unlike Silicon (Si) and Gallium Arsenide (GaAs), however, InP does not have a well-established transistor technology. Among the first InGaAs integrated photoreceivers were those utilizing a p-i-n photodiode and amplifier made from field effect transistors (FETs). Typically, a p-i-n photodiode requires a few micrometer thick, lightly doped epitaxial photoabsorbing layer on a heavily doped substrate in order to achieve high speed and high responsivity, while an FET requires a few hundred Angstrom thick, heavily doped channel on a semi-insulating substrate in order to achieve high transconductance. Due to this conflicting characteristic in the epilayer structure for the photodiode and the FET, either ion-implantation or diffusion into the InP substrate is required, which disadvantageously increases the processing complexity. Examples of integrated photoreceivers based on the above p-i-n/FET approach are shown in Kim et al., *IEEE Electron Device Letters*, Vol. 9, No. 9 pp. 447-9 (1988) and Renaud et al., *Journal of Lightwave Technology*, Vol. 6, No. 10, pp. 1507-11 (1988).

Other alternatives to the above p-i-n/FET approach having better materials compatibility have recently been reported in the technical literature. These alternatives utilize either metal-insulator semiconductor FETs(MISFETs) or high electron mobility transistors (HEMTs) instead of conventional FETs for fabricating the amplifier. See, for example, Antreasyan et al., *IEEE Photonics Technology Letters*, Vol. 1, No. 6 pp. 123-5 (1989) and Nobuhara et al., *Electron Letters*, Vol. 24, pp. 1246-48 (1988). Typically, in the above alternatives, a two growth epilayer process is required so that the separate layers for the photodetector and transistor are fabricated in different growth runs. Furthermore, InP MISFETs are still substantially prone to drain current drift phenomena, which may prevent long term functionality, while the speed of HEMTs is critically predicated on device dimensions.

An integrated photoreceiver using an InP/InGaAs heterostructure phototransistor (HPT) has recently been developed by one of the inventors as an alternative to the p-i-n/FET approach in order to achieve greater materials compatibility and, moreover, to overcome some of the limitations imposed by the utilization of MISFETs and HEMTs. See, Chandrasekhar et al., *Electronic Letters* Vol. 24, No. 23 pp. 1443-4 (1988). However, the dual functionality of the HPT, that is as photodetector and amplifier, results in a compromise in the optimal performance of the photonic and electronic function thereof.

One solution to the control optimization has been the monolithic integration of an HBT, HEMT and p-i-n photodiode on a patterned InP substrate. See, Sasaki et al., *IEDM* 89, pp. 896-8. HBTs, which incorporate an emitter region with a bandgap energy greater than that of the base region, allow a higher base doping and lower emitter doping that result in excellent device performance. For a discussion on HBTs, see U.S. Pat. No. 4,794,449, which is incorporated herein by reference. In fact, when compared with semiconductor FETs, HBTs offer higher transconductance and drive capability. Accordingly, the utilization of HBTs results in a high sensitivity monolithic photoreceiver. More importantly, HBTs may be fabricated with modest lithographic design rules while still maintaining speed performance and noise margin characteristics comparable with FETS.

The integration shown by Sasaki et al. was accomplished using the selective regrowth capabilities of metal-organic chemical vapor deposition (MOCVD). While the epitaxial layers used to form the HEMT and HBT were stacked on each other for ease of fabrication, in order to achieve planarity for gate lithography, areas on the substrate where the HBT and HEMT were to be realized had to be etched to form trenchs, i.e., a patterning of the substrate. Thus, by requiring the substrate to be initially patterned, a complex two step MOCVD process had to be incorporated in order to subsequently integrate the HBT and photodiode.

In view of reducing the processing complexity, it is therefore desirable to develop a monolithic integrated HBT photoreceiver not only having enhanced materials compatibility but also separate optimization control over the photonics and electronics functions.

SUMMARY OF THE INVENTION

A monolithic integrated photoreceiver comprising a photodetector and a heterojunction bipolar transistor is achieved in accordance with the principles of the invention. The structural configuration of the photoreceiver allows the photonics and electronics functions to be separately optimized while maintaining materials compatibility.

These desirable characteristics are accomplished by growing the epilayers of the photodetector and heterojunction bipolar transistor in a single step epitaxial growth run. The epilayers of the photodetector are grown first on a non-patterned InP substrate, followed by the direct epitaxial growth of the heterostructure bipolar transistor disposed over semiconductor layers previously contiguous with the epilayers of the photodetector structure. Selective wet chemical etching over a portion of the entire structure was used to remove the transistor structure in order to delineate a first mesa structure forming the photodetector. Additional selective etching then defined a second mesa structure including the epilayers of the heterostructure bipolar transistor and photodetector. Self-aligned base contact techniques together with the utilization of a polyimide layer for planarization and passivation completed the photoreceiver structure. Ohmic contacts to the individual semiconductor layers of the photodetector and bipolar transistor, facilitated by window openings in the polyimide, are achieved by reactive ion etching of the polyimide in an oxygen plasma.

In one embodiment, a p-i-n photodiode comprises a p+ InP layer, a n− InGaAs layer and n+ InP layer grown on a planar <001> oriented Fe:InP substrate. The heterostructure bipolar transistor, grown over a prior portion of epilayers of the photodiode structure, but now isolated therefrom by etching to the substrate, comprises an n type InP emitter, p+ InGaAs base and n− InGaAs collector. Importantly, the devices prior to etching were patterned 45° to the [001] and [01$\bar{1}$] crystallographic direction planes so that the epilayer structure maintained the geometrical shape of the photoresist mask used therein, which in turn afforded self-aligned contacts to be realized. With the active photodiode physically separated from the transistor, each device individually could be optimized. Moreover, the fabrication of the transistor directly over isolated layers fabricated by the same growth run as the epilayers of the photodiode, afforded direct materials compatibility and, thus, reduced processing complexity.

BRIEF DESCRIPTION OF THE DRAWING

A more complete understanding of the invention may be obtained by reading the following description in conjunction with the appended drawing in which.

DETAILED DESCRIPTION

Figure 1:
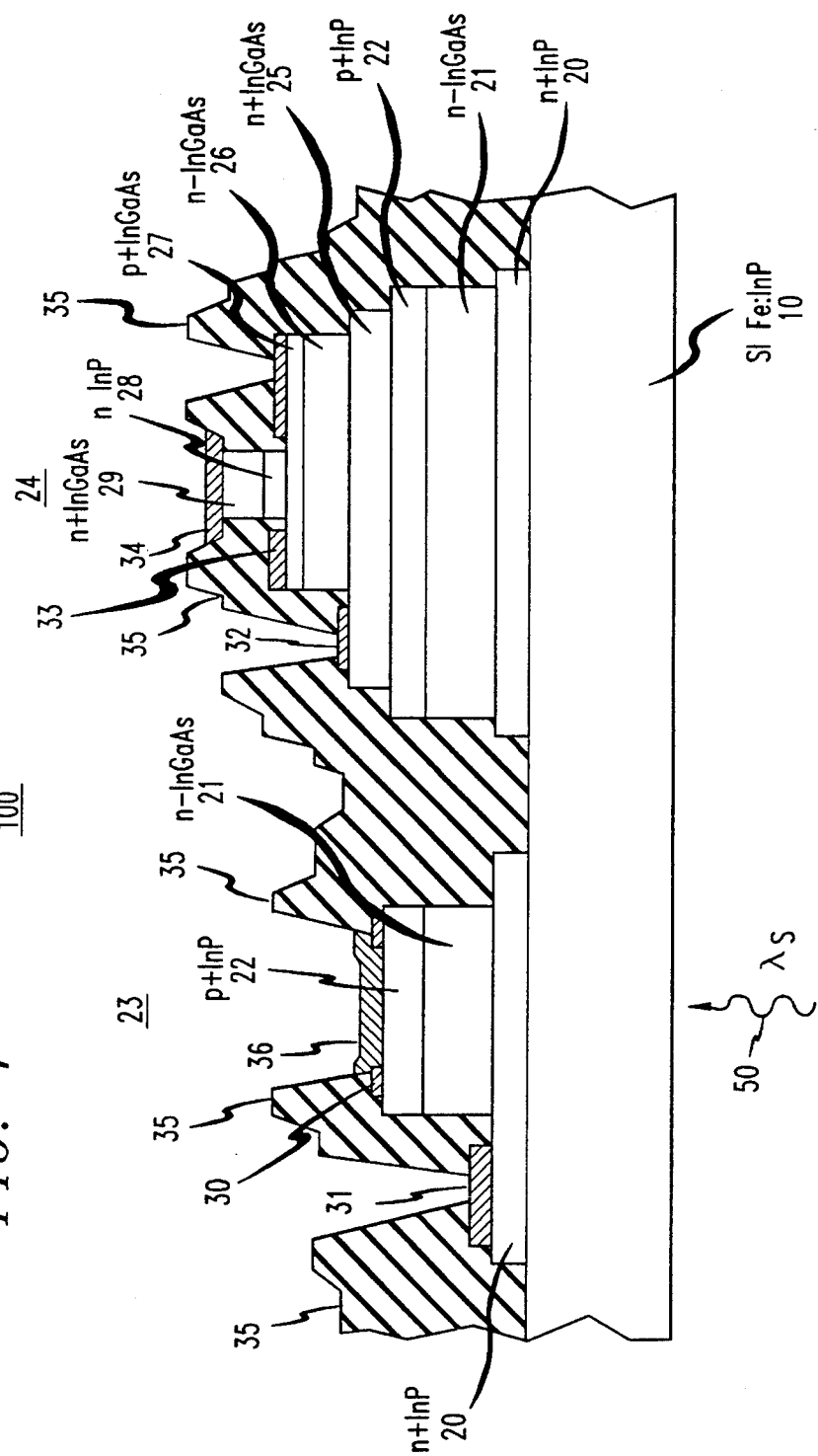
FIG. 1 shows a cross-sectional view of an exemplary embodiment of a monolithic integrated photoreceiver in accordance with the principles of the invention.

In accordance with the principles of the invention, a monolithic integrated photoreceiver comprising a p-i-n photodiode and heterostructure bipolar transistor (HBT) has been realized in the InP/InGaAs material system. As shown in FIG. 1, photoreceiver 100 detects and amplifies optical beam 50 which impinges on p-i-n photodiode 23 at a wavelength $\lambda_s$. For the particular device structure described below, $\lambda_s$ is chosen to be greater than 1.0 $\mu$m because, among other reasons, the InP semiconductor is transparent for those wavelengths. This integrated photoreceiver advantageously affords materials compatibility and separate optimization control over the photonics and electronics functions because each device is electrically isolated as well as physically separated from each other. That is, no contiguous conductive semiconductor layer exists between the photodiode and HBT. Since a heterostructure bipolar transistor 24 is grown over semiconductor layers once contiguous with the layers of the photodiode, and is then isolated by wet chemical etching, the processing complexity is substantially reduced when compared to the prior art because no trenches or pre-etched groove regions are required. It should be noted that the semiconductor layers underlying the HBT, while structurally adapted for forming a photodiode, are not electrically or optically active.

In the present integrated photoreceiver, the photodiode and heterostructure bipolar transistor having semiconductor layers selected from the InP/InGaAs material system are grown over a non-patterned Fe doped InP substrate. Alternatively stated, neither device structure was fabricated in pre-etched groove regions or trenches, thereby reducing the processing complexity. Standard fabrication techniques including metalorganic vapor phase epitaxy (MOVPE), selective wet chemical etching, reactive ion etching and contact metallization are used to fabricate a device in accordance with the principles of the invention. These fabrication techniques are well-known to those persons of ordinary skill in the art and, thus, are not discussed in detail here.

FIG. 1 schematically depicts an exemplary monolithic integrated photoreceiver in accordance with the principles of the invention. The exemplary embodiment is epitaxially grown on a planar Fe doped <001> oriented InP substrate 10 made by the vertical gradient freeze (VFG) technique described in U.S. Pat. Nos. 4,404,172 and 4,521,272, which are incorporated herein by reference. The p-i-n epilayers comprising 4000 Å thick InP layer 20 (n=2×10$^{18}$cm$^{-3}$), 1.0 $\mu$m thick InGaAs layer 21 (n=5×10$^{15}$cm$^{-3}$) and 4000 Å thick InP layer 22 (p=2×10$^{18}$cm$^{-3}$) were grown on semi-insulating substrate 10 by MOVPE. Semiconductor layers 20, 21, and 22 form p-i-n photodiode 23. Importantly, in the same single growth run, the epitaxial layers of heterostructure bipolar transistor (HBT) 24 are grown over the entire structure. In the single growth run, no intervening processing exists between the deposition of each epilayer. That is, the growth run is continuous and uninterrupted.

In this exemplary embodiment, HBT 24 comprises: sub-collector layer 25 (4000 Å thick InGaAs, n=5×10$^{18}$cm$^{-3}$); collector layer 26 (2500 Å thick InGaAs, n=5×10$^{15}$cm$^{-3}$); base layer 27 (1000 Å thick InP, p=2×10$^{18}$cm$^{-3}$); emitter layer 28 (2000 Å thick InP, n=1×10$^{17}$cm$^{-3}$); and the emitter cap layer 29 (3000 Å thick InGaAs, n=5×10$^{18}$cm$^{-3}$). It should be noted that HBT 24 is a single heterostructure device with a nominal base thickness of 1000 Å, while photodetector 23 has a photoabsorbing layer 21 of approximately 1 $\mu$m.

After the growth of the photodiode and heterostructure bipolar transistor epilayers, wet chemical etching was performed to realize the mesa structures thereof. In experimental practice, solutions of 3:1:1 $H_2SO_4$:$H_2O_2$:$H_2O$ (an InGaAs selective etch) and 1:2 HCl:$H_3PO_4$ (an InP selective etch) were use to produce the mesa structures as shown in FIG. 1. Importantly, in conjunction with the wet chemical etch, photoresist patterning was oriented 45° to the [001] and [00$\bar{1}$] crystallographic direction planes in order to maintain the geometrical shape of the mesa structure. Alternatively stated, the line features of the devices, that is, photodiode 23 and HBT 24, are delineated so that they are 45° to the [001] and [00$\bar{1}$] direction planes. Conventional ohmic contacts, such as AuGe/Au and AuZn/Au, were deposited on the lateral edges of the mesa in order to provide ohmic contacts 31, 32, 33, and 34 to n+ layer 20, subcollector layer 25, base layer 27, and emitter cap layer 29, respectively. It should be noted that standard metallic deposition techniques are employed in fabricating the ohmic contact. Additionally, for photodetector 23, an annular alloyed ohmic contact 30 provides contact to p+ InP layer 22. Annular ohmic contact 30 may be formed by standard photolithographic, including evaporation and lift-off techniques well-known in the art. To reflect any unabsorbed optical beam 50 back into photoabsorbing region 21 and, thus, increase the quantum efficiency, a non-alloyed Cr/Au metal contact 36 was deposited in the annular opening of contact 30. After planarization and passivation, such as by using a spun-on polyimide 35, reactive ion etching of the polyimide in an oxgen plasma was employed to open windows therein in order to facilitate attaching leads, not shown, to the ohmic contacts. It is anticipated that, after fabrication, substrate 10 will be thinned and polished in order to permit backside illumination.

Figure 2:
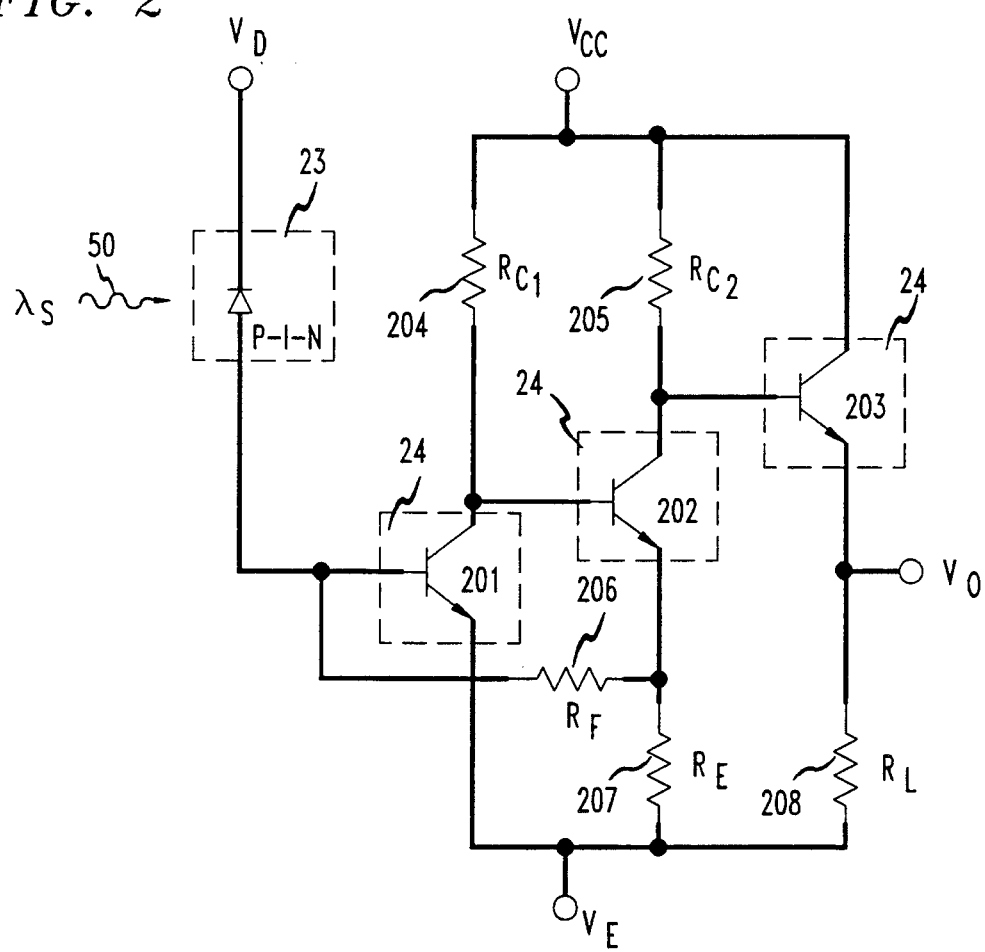
FIG. 2 shows an exemplary circuit diagram utilizing the photoreceiver shown in FIG. 1.

In an example from experimental practice, FIG. 2 illustrates the circuit diagram of a photoreceiver circuit fabricated in accordance with the description above. The photoreceiver circuit was designed using the computer program SPICE TM to operate at a bit rate of 1 Gbit/s, with a transimpedance of 1400 Ω and a bandwidth of 600 MHz. A transimpedance configuration was chosen because of its inherent wide bandwidth and large dynamic range. In particular, the circuit comprises three heterostructure bipolar transistors 201, 202 and 203 for amplification, each having the mesa structure of HBT 24, and five resistors 204 ($R_{C1}$), 205 ($R_{C2}$), 206 ($R_F$), 207 ($R_E$) and 208 ($R_L$) for biasing and feedback. The detected photocurrent from p-i-n photodiode 23 is amplified by HBT 201 and 202, with HBT 203 acting as an output buffer stage. All the HBTs were substantially identical having 7 μm×13 μm emitters and 15 μm×33 μm bases, while p-i-n photodiode 23 had a 44 μm×44 μm photosensitive area. Feedback resistor 206 ($R_F$) has a resistance of 1000 Ω whereas bias resistors 204, 205, 207 and 208 had measured resistances of 500 Ω, 300 Ω, 150 Ω and 300 Ω, respectively. It is should be noted that the resistors were fabricated by evaporating NiCr metal.

Figure 3:
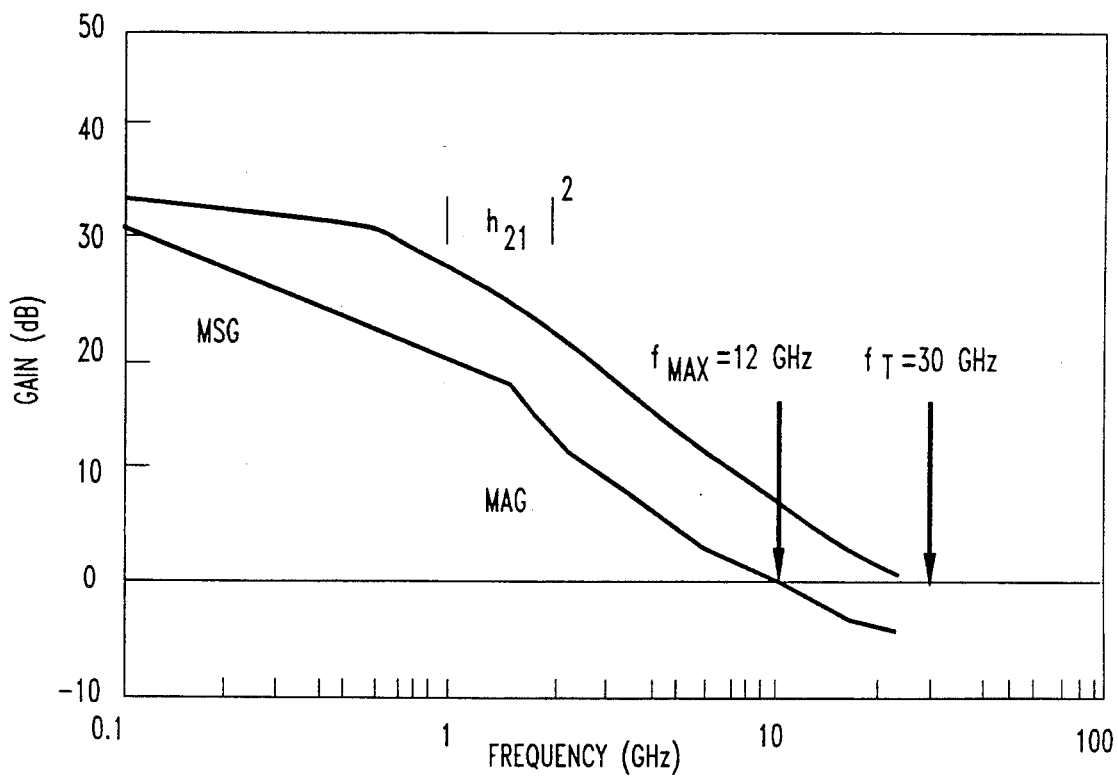
FIGS. 3-7 show the performance characteristics for the photoreceiver circuit shown in FIG. 2.
Figure 4:
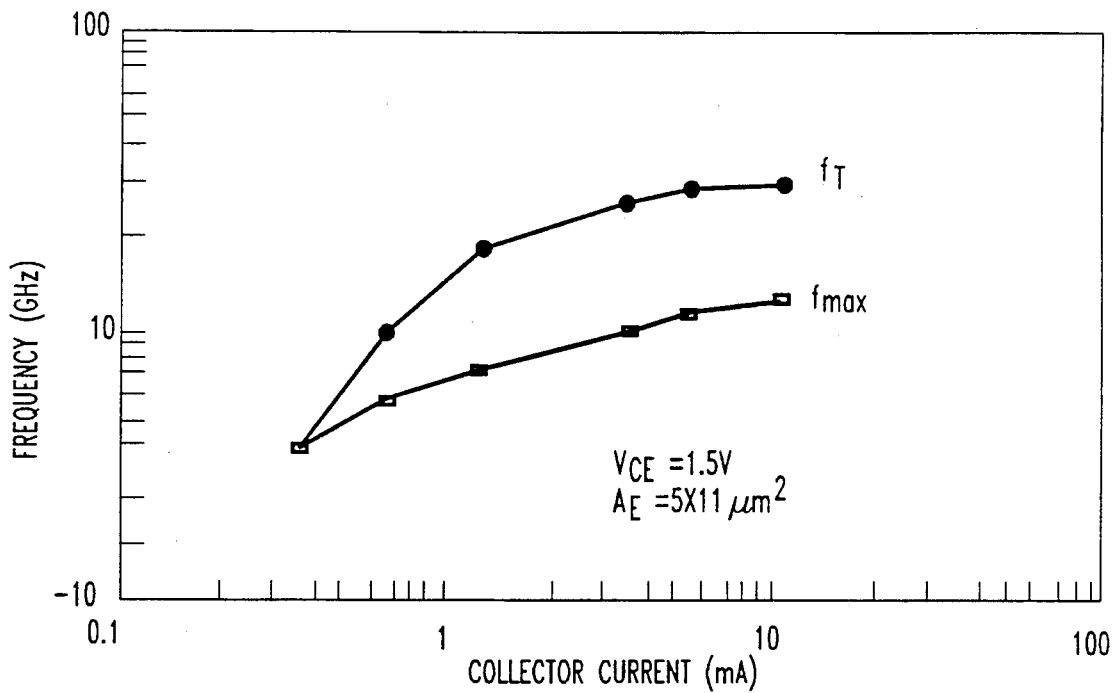

Results from experimental practice indicate that each HBT had a small signal current gain of approximately 35. With the use of a microwave S-parameter network analyzer, the frequency response of the transistors was measured. Shown in FIG. 3 are typical frequency response measurements. It should specifically be noted that the unity current gain cut-off frequency $f_T$ and the maximum oscillation frequency $f_{max}$ were 30 GHz and 12 GHz, respectively, for a collector current of 5 mA. The dependence of $f_T$ and $f_{max}$ on the collector current, which is illustrated in FIG. 4, indicates that below a collector current of 5 mA, the frequency response is limited by the emitter charging time whereas for a collector current above 5 mA the frequency response is limited by the collector charging time.

Figure 5:
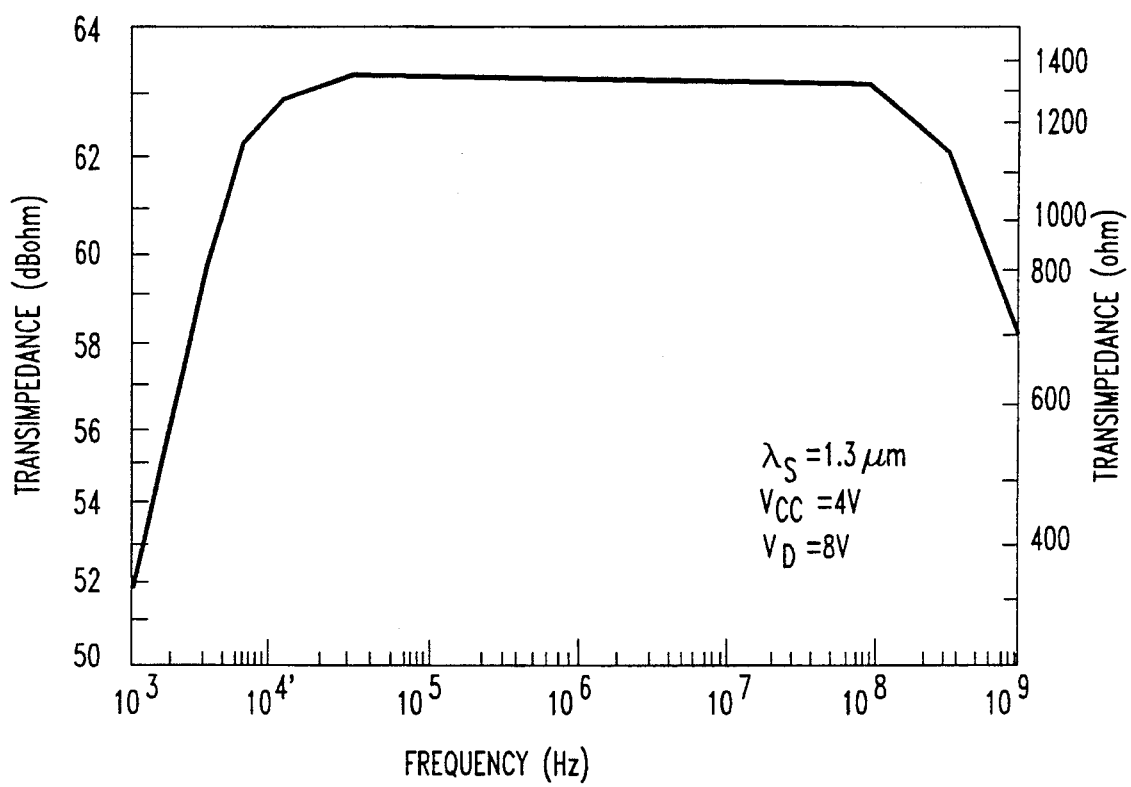

Further experimental measurements indicate that p-i-n photodiode 23 had a leakage current of 35 nA at a reverse bias of ∼10.0 V and a quantum efficiency of approximately 60% at a wavelength of 1.3 μm. With the photoreceiver circuit packaged into a printed circuit board with microstriplines, the small signal frequency response was measured for impinging optical beam 50 having a wavelength of 1.3 μm. FIG. 5 illustrates the results, indicating a 3 dB bandwidth of 500 MHz and a transimpedance of 1375 Ω. The measured transimpedance when combined with the responsivity of the p-i-n photodiode, corresponds to an overall receiver responsivity of ∼907 V/W.

Figure 6:
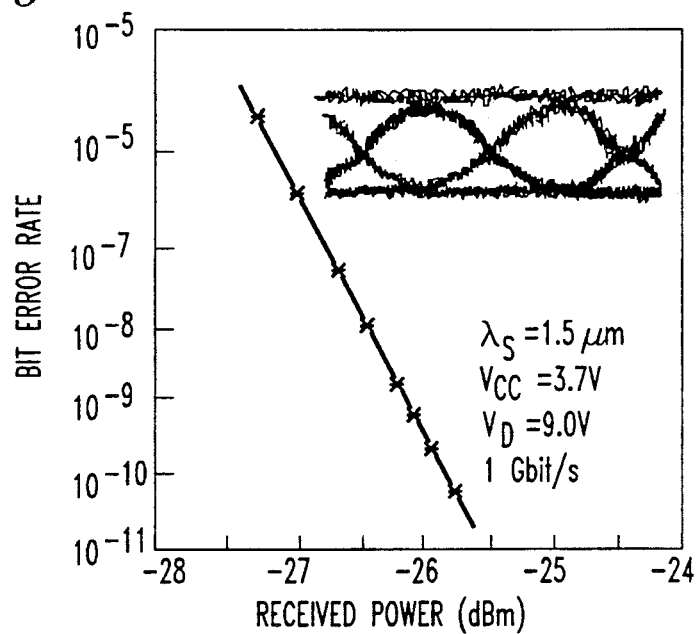
Figure 7:
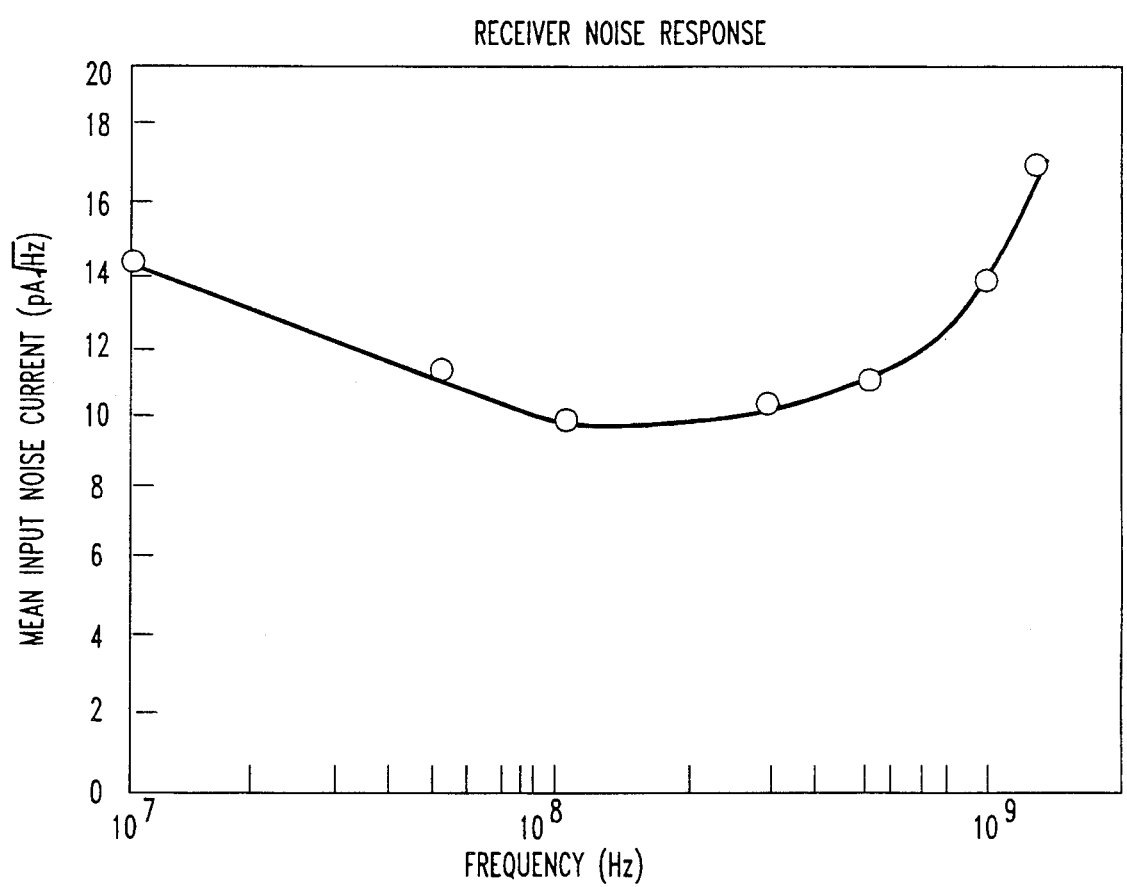

Additional measurements were performed to determined the receiver sensitivity for optical signal 50 ($\lambda_s \sim$ 1.5 μm) incident on photodiode 23 having a 1 Gbit/sec, non-return-to-zero (NRZ), pseudorandom signaling format. As shown in FIG. 6, the sensitivity was measured to be approximately −26.1 dBm with a bit error rate of $10^{-9}$. It was noted during the measurements that as the optical input power increased, no noticeable saturation occurred even for input power levels as large as 0 dBm. Accordingly, it is believed that the photoreceiver has a dynamic range greater than 25 dB of optical power. Measurements of the input current noise spectrum, which were made between 10 MHz to 1.2 GHz and shown in FIG. 7, indicate an average noise current of 11 pA/$\sqrt{\text{Hz}}$ over the bandwidth of the receiver, with no significant 1/f noise component down to 10 MHz.

We claim:

1. A monolithic integrated photoreceiver comprising:
   a non-patterned semi-insulating InP substrate;
   a first mesa structure formed on said substrate including a first plurality of InP/InGaAs semiconductor layers for forming a p-i-n photodiode; and
   a second mesa structure formed on said substrate including a second plurality of InP/InGaAs semiconductor layers deposited over a third plurality of InP/GaAs semiconductor layers, wherein said second plurality of InP/InGaAs semiconductor layers forms a heterostructure bipolar transistor, said first, second and third pluralities of InP/InGaAs semiconductor layers being deposited by a substantially uninterrupted epitaxial growth process, and said first plurality of InP/InGaAs semiconductor layers being substantially identical to said third plurality of InP/InGaAs semiconductor layers.

2. A monolithic integrated photoreceiver comprising:
   a non-patterned semi-insulating InP substrate;
   a first mesa structure formed on said substrate including a first plurality of InP/InGaAs semiconductor layers for forming a p-i-n photodiode; and
   a second mesa structure formed on said substrate including a second plurality of InP/InGaAs semiconductor layers deposited over a third plurality of InP/InGaAs semiconductor layers, wherein said second plurality of InP/InGaAs semiconductor layers forms a heterostructure bipolar transistor, said first, second and third pluralities of InP/InGaAs semiconductor layers being deposited by a substantially uninterrupted epitaxial growth process, and said first plurality of InP/InGaAs semiconductor layers being substantially identical to said third plurality of InP/InGaAs semiconductor layers,
   said first plurality of InP/InGaAs semiconductor layers includes a first InGaAs semiconductor layer for forming a photoabsorbing layer for an impinging optical radiation, and second and third InP semiconductor layers having opposite conductivity type, each being disposed adjacent to said first InGaAs semiconductor layer such that a pn junction is formed.

3. The monolithic integrated photoreceiver as defined in claim 2 wherein said second plurality of InP/InGaAs semiconductor layers includes an InP emitter semiconductor layer, an InGaAs base semiconductor layer and an InGaAs collector semiconductor layer.

4. The monolithic integrated photoreceiver as defined in claim 3 wherein said first and second pluralities of InP/InGaAs semiconductor layers are deposited on the <001> crystallographic plane of said InP substrate.

5. The monolithic integrated photoreceiver as defined in claim 4 wherein line features of said p-i-n photodiode and said heterostructure bipolar transistor are delineated by etching at 45° to the [001] and [00$\bar{1}$] crystallographic direction planes.

6. The monolithic integrated photoreceiver as defined in claim 5 further comprising a polyimide layer deposited over said p-i-n photodiode and said heterostructure bipolar transistor.

7. The monolithic integrated photoreceiver as defined in claim 6 further comprising first, second, third, fourth, and fifth electrical contacts to said third InP semiconductor layer, said second InP semiconductor layer, said InGaAs collector semiconductor layer, said InGaAs base semiconductor layer and said InP emitter semiconductor layer, respectively.

8. The monolithic integrated photoreceiver as defined in claim 7 wherein said second electrical contact to said second InP semiconductor layer is an annular electrical contact.

9. The monolithic integrated photoreceiver as defined in claim 8 further comprising a reflecting surface disposed over an annular electrical contact for reflecting said impinging optical radiation back to said photoabsorbing layer of said p-i-n photodiode.

10. The monolithic integrated photoreceiver as defined in claim 9 wherein said reflecting surface is a non-alloyed contact.

* * * * *